United States Patent
Jeong et al.

(10) Patent No.: US 9,871,600 B2
(45) Date of Patent: Jan. 16, 2018

(54) WIRELESS SWITCH

(71) Applicant: SAMSUNG ELECTRO-MECHANICS CO., LTD., Suwon-si (KR)

(72) Inventors: In Wha Jeong, Suwon-si (KR); Jong Heum Park, Suwon-si (KR); Hugh Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 316 days.

(21) Appl. No.: 14/797,693

(22) Filed: Jul. 13, 2015

(65) Prior Publication Data

US 2016/0013873 A1 Jan. 14, 2016

(30) Foreign Application Priority Data

Jul. 14, 2014 (KR) .................. 10-2014-0088607
Apr. 22, 2015 (KR) .................. 10-2015-0056484

(51) Int. Cl.
| | | |
|---|---|---|
| *H01H 35/00* | (2006.01) | |
| *H04B 17/16* | (2015.01) | |
| *H02N 2/18* | (2006.01) | |
| *H01L 41/113* | (2006.01) | |
| *H03K 17/96* | (2006.01) | |

(52) U.S. Cl.
CPC .......... *H04B 17/16* (2015.01); *H01L 41/1134* (2013.01); *H01L 41/1136* (2013.01); *H02N 2/18* (2013.01); *H03K 17/964* (2013.01); *H01H 2300/03* (2013.01); *Y02B 90/224* (2013.01); *Y04S 20/14* (2013.01)

(58) Field of Classification Search
CPC ...... H04B 17/16; H02N 2/18; H01H 2300/03; H01L 41/1136
USPC ......................................................... 307/116
See application file for complete search history.

(56) References Cited

U.S. PATENT DOCUMENTS

| | | | | |
|---|---|---|---|---|
| 7,692,559 | B2 * | 4/2010 | Face .................... | H03K 17/951 307/119 |
| 2008/0062013 | A1 * | 3/2008 | Face .................... | H03K 17/951 341/20 |

(Continued)

FOREIGN PATENT DOCUMENTS

| | | |
|---|---|---|
| JP | 2004-201376 A | 7/2004 |
| JP | 2006-158112 A | 6/2006 |
| WO | WO 2012/157246 A1 | 11/2012 |

OTHER PUBLICATIONS

Korean Office Action dated Jul. 21, 2016 in counterpart Korean Application No. 10-2015-0056484. (9 pages in Korean with English translation).

*Primary Examiner* — Jared Fureman
*Assistant Examiner* — Duc M Pham
(74) *Attorney, Agent, or Firm* — NSIP Law

(57) ABSTRACT

There is provided a wireless switch including: an energy harvesting unit generating a first signal and a second signal when a first button is pressed and when the first button is released, respectively; a measuring unit measuring a period of time from a time at which the first signal is generated to a time at which the second signal is generated; and a wireless signal transmitting unit transmitting a control signal depending on the period of time measured by the measuring unit.

11 Claims, 8 Drawing Sheets

(56) References Cited

U.S. PATENT DOCUMENTS

2012/0293042 A1* 11/2012 Suzuki .............. H01L 41/1136
310/321
2014/0097709 A1 4/2014 Ueno et al.

* cited by examiner

WIRELESS SWITCH

CROSS-REFERENCE TO RELATED APPLICATIONS

This application claims the priorities and benefits of Korean Patent Application Nos. 10-2014-0088607 filed on Jul. 14, 2014 and 10-2015-0056484 filed on Apr. 22, 2015, with the Korean Intellectual Property Office, the disclosures of which are incorporated herein by reference.

BACKGROUND

The present disclosure relates to a wireless switch including an energy harvesting unit.

Generally, a wireless lighting control system includes a power module, a lighting unit in which a communications module is embedded, a wireless lighting controller, a network device connecting the lighting unit and the wireless lighting controller to each other, an illumination sensor, and the like.

However, a current wireless lighting control system requires a separate wireless lighting controller and a network device. Therefore, it is difficult to use current wireless lighting control systems in environments such as domestic dwellings due to relatively complicated structures and high manufacturing costs thereof, depending on system configurations.

SUMMARY

An aspect of the present disclosure may provide a wireless switch including an energy harvesting unit.

According to an aspect of the present disclosure, a wireless switch may include: an energy harvesting unit generating a first signal and a second signal when a first button is pressed and when the first button is released, respectively; a measuring unit measuring a period of time from a time at which the first signal is generated to a time at which the second signal is generated; and a wireless signal transmitting unit transmitting a control signal depending on the period of time measured by the measuring unit.

BRIEF DESCRIPTION OF DRAWINGS

The above and other aspects, features and advantages of the present disclosure will be more clearly understood from the following detailed description taken in conjunction with the accompanying drawings, in which.

DETAILED DESCRIPTION

Hereinafter, embodiments of the present disclosure will be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

Figure 1:
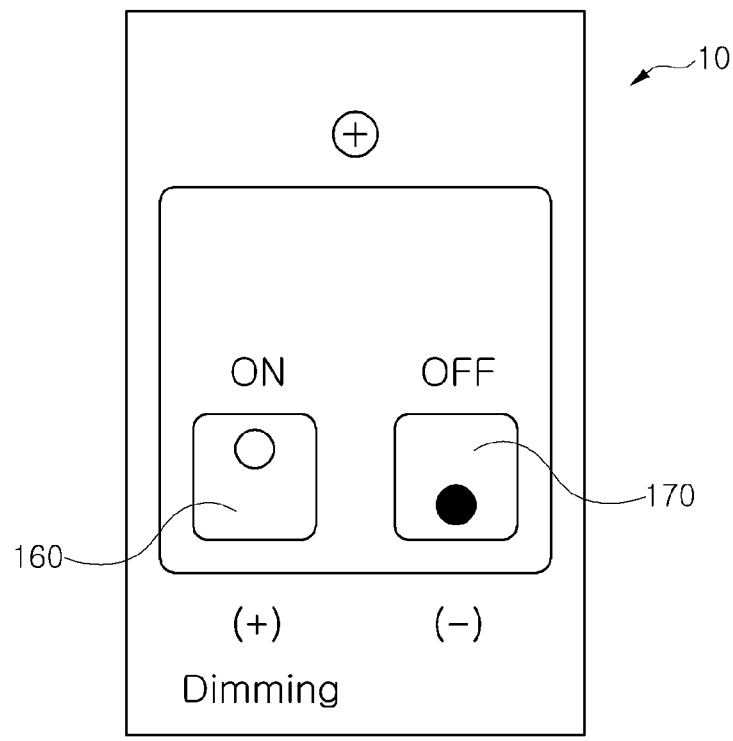
FIG. 1 is a plan view of a wireless switch according to an exemplary embodiment in the present disclosure.
Figure 2:
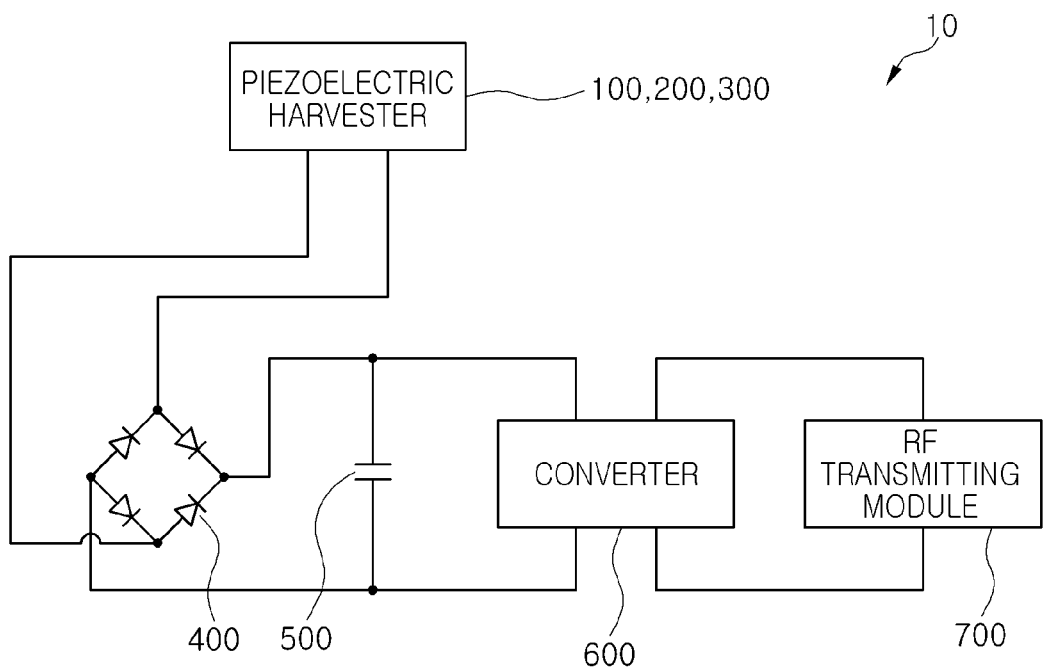
FIG. 2 is a view schematically illustrating a configuration of the wireless switch according to an exemplary embodiment in the present disclosure.

FIG. 1 is a plan view of a wireless switch according to an exemplary embodiment in the present disclosure; and FIG. 2 is a view schematically illustrating a configuration of the wireless switch according to an exemplary embodiment in the present disclosure.

Referring to FIGS. 1 and 2, the wireless switch according to the exemplary embodiment may include energy harvesting units 100, 200, and 300, a rectifier 400, a capacitor 500, a converter 600, and a wireless signal transmitting module 700.

Energy generated in the energy harvesting units 100, 200, and 300 may pass through the rectifier 400, be stored in the capacitor 500, converted to a stable voltage by the converter 600, and may be transmitted to the wireless signal transmitting unit 700.

The wireless signal transmitting unit 700 may generate a radio frequency communications signal depending on an input signal. The RF communications signal may be transmitted to an RF receiving module of an external electronic device.

The external electronic device may be a lighting device such as a light emitting diode (LED) lamp, or the like.

That is, the wireless switch according to an exemplary embodiment may use the energy generated in the energy harvesting units 100, 200, and 300 as driving power of the wireless signal transmitting unit 700 to transmit turn-on and turn-off signals to the external electronic device.

In addition, the wireless switch according to an exemplary embodiment may transmit a dimming signal as well as the turn-on and turn-off signals to the external electronic device. This will be described below with reference to FIG. 8.

Therefore, a wireless control system may be simply built without using a mechanically complicated component in order to connect a switch to a lighting device, or the like, in a home.

Next, a configuration of the energy harvesting unit 100 generating energy used as driving power of the wireless signal transmitting unit 700, according to a first exemplary embodiment, will be described with reference to FIGS. 3 through 5B.

Figure 3:
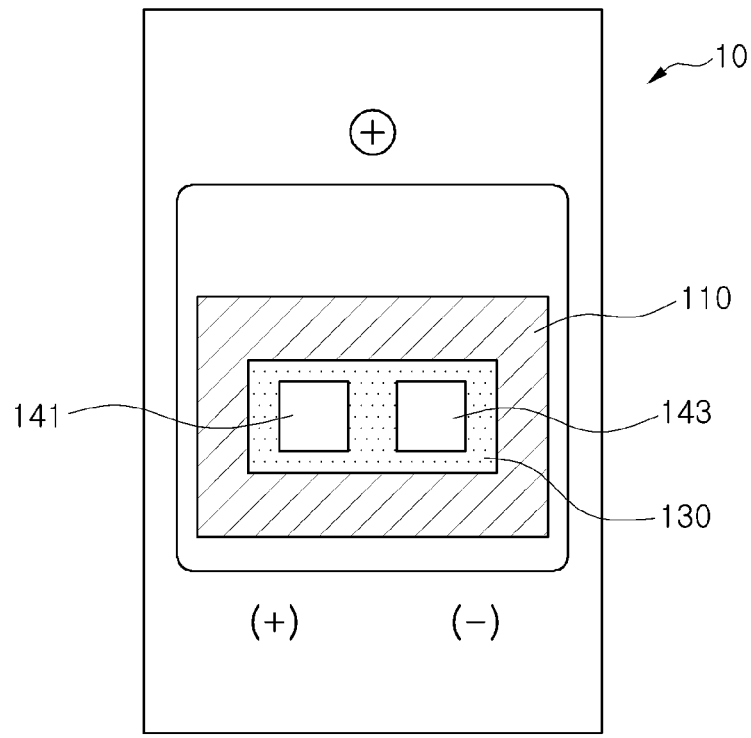
FIG. 3 is a partially cut-away plan view of the wireless switch illustrated in FIG. 1 according to an exemplary embodiment in the present disclosure.
Figure 4:
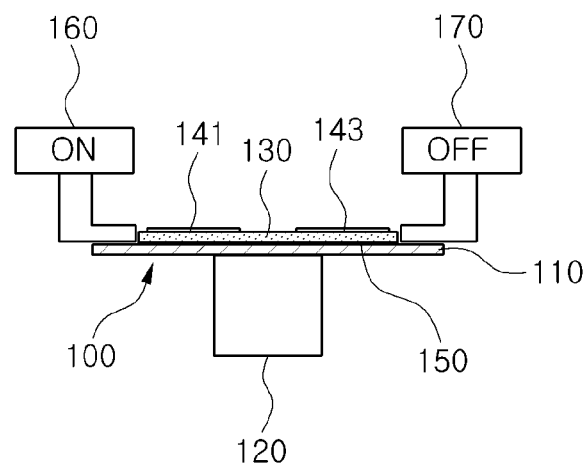
FIG. 4 is a cross-sectional view of an energy harvesting unit according to an exemplary embodiment in the present disclosure.
Figure 5A:
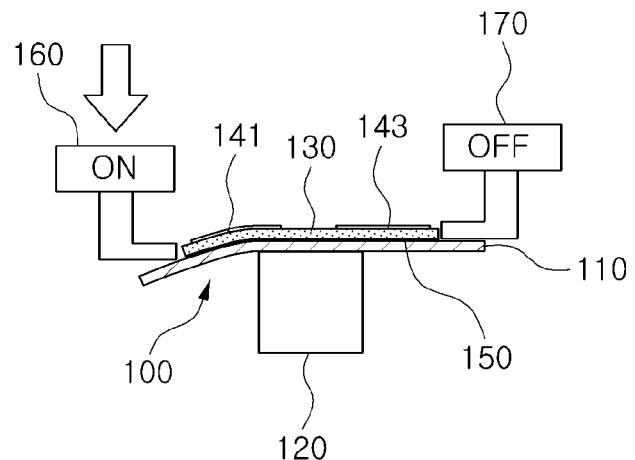
FIGS. 5A and 5B are cross-sectional views illustrating an operational state of the energy harvesting unit according to a first exemplary embodiment in the present disclosure.
Figure 5B:
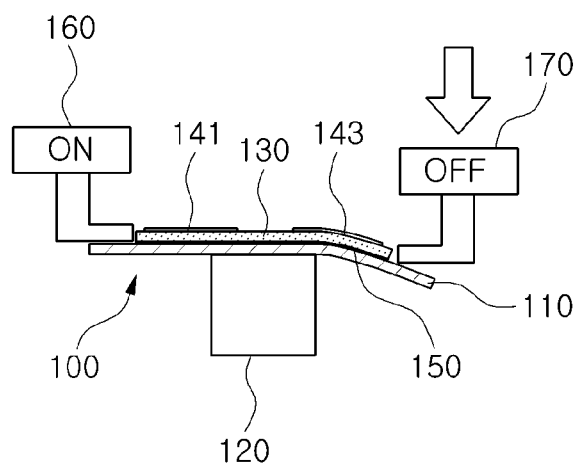

FIG. 3 is a partially cut-away plan view of the wireless switch illustrated in FIG. 1; FIG. 4 is a schematic cross-sectional view illustrating the energy harvesting unit and turn-on and turn-off buttons according to the exemplary embodiment; and FIGS. 5A and 5B are cross-sectional views illustrating a process of generating energy in the energy harvesting unit, according to the first exemplary embodiment.

First, referring to FIGS. 3 and 4, the energy harvesting unit 100 according to the first exemplary embodiment may include a thin film member 110, a support member 120 supporting the thin film member 110, a piezoelectric member 130 provided on the thin film member 110, first and second upper electrodes 141 and 143 provided on one surface of the piezoelectric member 130, and a common electrode 150 provided on the other surface of the piezoelectric member 130.

As illustrated in FIG. 4, the energy harvesting unit 100 according to the first exemplary embodiment may be provided with one piezoelectric member 130 and two upper electrodes 141 and 143.

In addition, a turn-on button 160 and a turn-off button 170 may be disposed in positions corresponding to one side and the other side of the thin film member 110, respectively, in relation to the support member 120.

The thin film member 110 may have a plate shape having elasticity, and may be supported by the support member 120.

The support member 120 may be disposed in a position corresponding to a central portion of the thin film member 110 below the thin film member 110 to support the thin film member 110. Therefore, in a case in which external force is applied to both sides of the thin film member 110 in relation to the support member 120, displacement may be re-generated in portions of the thin film member 110 to which external force is applied.

The piezoelectric member 130 may be provided on the thin film member 110. Therefore, when displacement is generated in the thin film member 110, displacement may also be generated in the piezoelectric member 130, and thus, a piezoelectric effect, in which a potential difference appears, may occur.

For example, when displacement is generated in the thin film member 110, displacement may also be generated in the piezoelectric member 130 provided on the thin film member 110, and electrical polarization may be generated in the piezoelectric member 130. Therefore, a voltage may be generated in the first upper electrode 141 or the second upper electrode 143 provided on one surface of the piezoelectric member 130, and an output current generated from the voltage may be used as the driving power of the wireless signal transmitting unit 700.

The piezoelectric member 130 may be formed of lead zirconate titanate, barium titanate ($BaTiO_3$), lead titanate ($PbTiO_3$), lithium niobate ($LiNbO_3$), silicon dioxide ($SiO_2$), or the like.

The common electrode 150 may be provided in order to generate a potential difference, and be provided on the other surface of the piezoelectric member 130 to correspond to the first and second upper electrodes 141 and 143.

As illustrated in FIG. 4, the common electrode 150 may be disposed over the entirety of the other surface of the piezoelectric member 130. Alternatively, the common electrode 150 may be patterned and formed on portions of the other surface of the piezoelectric member 130 corresponding to the first and second upper electrodes 141 and 143.

The first and second upper electrodes 141 and 143 may be disposed on one surface of the piezoelectric member 130 to be spaced apart from each other.

For example, the first and second upper electrodes 141 and 143 may be disposed on one side and the other side of the piezoelectric member 130, respectively, in relation to the support member 120.

Next, a process of generating energy in the energy harvesting unit 100 according to the first exemplary embodiment will be described with reference to FIGS. 5A and 5B.

First, as illustrated in FIG. 5A, when a user presses the turn-on button 160, external force may be applied to one side of the thin film member 110 corresponding to the turn-on button 160, and displacement may be generated on one side of the thin film member 110.

When displacement is generated on one side of the thin film member 110 in relation to the support member 120, displacement may also be generated on one side of the piezoelectric member 130. As a result, a voltage may be generated in the first upper electrode 141 disposed on one side of the piezoelectric member 130.

Next, as illustrated in FIG. 5B, when a user presses the turn-off button 170, external force may be applied to the other side of the thin film member 110 corresponding to the turn-off button 170, and displacement may be generated on the other side of the thin film member 110.

When displacement is generated on the other side of the thin film member 110 in relation to the support member 120, displacement may also be generated on the other side of the piezoelectric member 130. As a result, a voltage may be generated in the second upper electrode 143 disposed on the other side of the piezoelectric member 130.

The voltages generated in the first and second upper electrodes 141 and 143 may be used as the driving power of the wireless signal transmitting unit 700, and the wireless signal transmitting unit 700 may transmit the RF communications signals to the external electronic device depending on inputs of the turn-on button 160 and the turn-off button 170.

Here, in a case in which the voltage is generated in the first upper electrode 141 depending on the input of the turn-on button 160, the wireless signal transmitting unit 700 may transmit the RF communications signal (here, a turn-on signal or a positive (+) dimming signal) to the external electronic device.

In addition, in a case in which the voltage is generated in the second upper electrode 143 depending on the input of the turn-off button 170, the wireless signal transmitting unit 700 may transmit the RF communications signal (here, a turn-off signal or a negative (−) dimming signal) to the external electronic device.

Figure 6A:
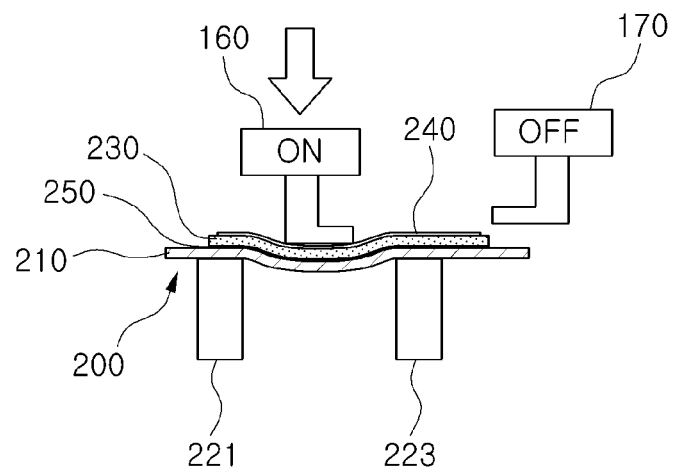
FIGS. 6A and 6B are cross-sectional views illustrating an operational state of the energy harvesting unit according to a second exemplary embodiment in the present disclosure.
Figure 6B:
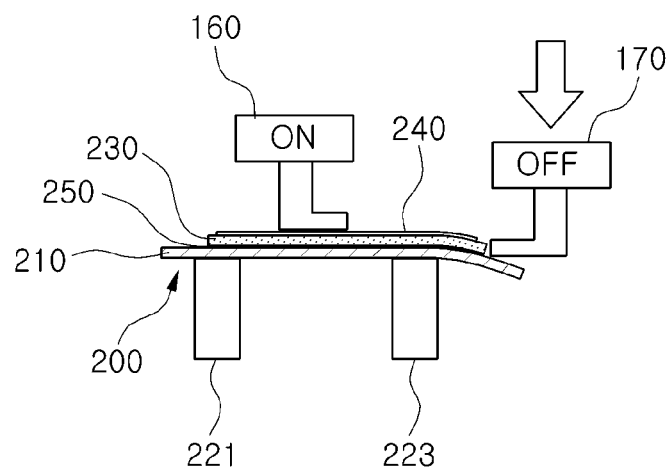

FIGS. 6A and 6B are schematic cross-sectional views illustrating a process of generating energy in the energy harvesting unit 200 according to a second exemplary embodiment in the present disclosure.

Referring to FIGS. 6A and 6B, the energy harvesting unit 200 according to the second exemplary embodiment may include a thin film member 210, first and second support members 221 and 223 supporting the thin film member 210, a piezoelectric member 230 provided on the thin film member 210, an upper electrode 240 provided on one surface of the piezoelectric member 230, and a lower electrode 250 provided on the other surface of the piezoelectric member 230.

The energy harvesting unit 200 according to the second exemplary embodiment may be provided with one piezoelectric member 230, one upper electrode 240, and one lower electrode 250.

In addition, the turn-on button 160 may be disposed in a position corresponding to a portion of the thin film member 210 positioned between the first and second support members 221 and 223, and the turn-off button 170 may be disposed in a position corresponding to one side or the other side of the thin film member 210 in relation to the first and second support members 221 and 223.

First, as illustrated in FIG. 6A, since the turn-on button 160 is disposed in a position corresponding to a central portion of the thin film member 210, when a user presses the turn-on button 160, external force may be applied to the central portion of the thin film member 210, such that the thin film member 210 may be bent in a 'U' shape.

A central portion of the piezoelectric member 230 may also be bent in a 'U' shape, depending on displacement of the thin film member 210. As a result, voltage may be generated in the upper electrode 240 disposed on one surface of the piezoelectric member 230.

Next, as illustrated in FIG. 6B, since the turn-off button 170 is disposed in a position corresponding to either one side or the other side of the thin film member 210 in relation to the first and second support members 221 and 223, when a user presses the turn-off button 170, external force may be applied to one side or the other side of the thin film member 210 corresponding to the turn-off button 170, such that displacement may be generated on one side or the other side of the thin film member 210.

In this case, the thin film member 210 may be bent in a '∩' shape.

The piezoelectric member 230 may also be bent in a '∩' shape depending on displacement of the thin film member 210. As a result, a voltage may be generated in the upper electrode 240 disposed on one surface of the piezoelectric member 230.

Here, shapes in which the thin film member 210 is bent may be different from each other, depending on the inputs of the turn-on button 160 and the turn-off button 170. In detail, a direction in which the thin film member 210 is bent when the turn-on button 160 is input and a direction in which the thin film member 210 is bent when the turn-off button is input may be opposite to each other.

Therefore, polarities of the voltages in the upper electrode 240 may be opposite to each other, and the wireless signal transmitting unit 700 may distinguish a turn-on signal and a turn-off signal from each other, depending on the polarities of the voltages and transmit an RF communications signal to an external electronic device.

Figure 7A:
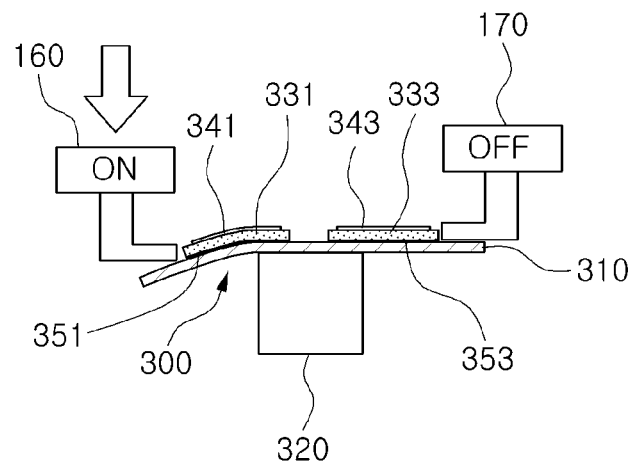
FIGS. 7A and 7B are cross-sectional views illustrating an operational state of the energy harvesting unit according to a third exemplary embodiment in the present disclosure.
Figure 7B:
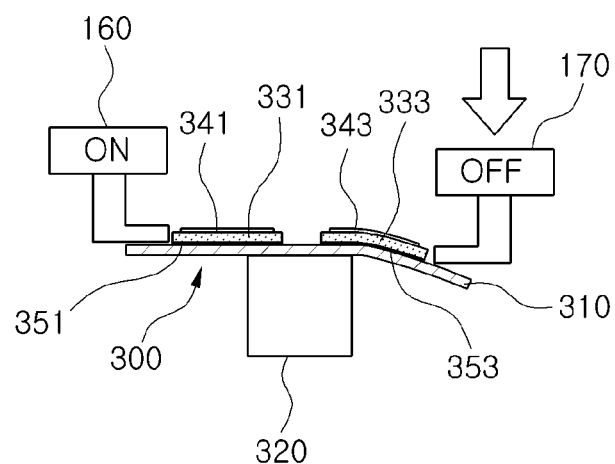

FIGS. 7A and 7B are schematic cross-sectional views illustrating a process of generating energy in the energy harvesting unit 300 according to a third exemplary embodiment in the present disclosure.

Referring to FIGS. 7A and 7B, the energy harvesting unit 300 according to the third exemplary embodiment may be driven in the same scheme as that of the energy harvesting unit 100, according to the first exemplary embodiment, except that it includes two piezoelectric members, two upper electrodes, and two lower electrodes.

The energy harvesting unit 300 according to the third exemplary embodiment may include a thin film member 310, a support member 320 supporting a central portion of the thin film member 310 below the thin film member 310, first and second piezoelectric members 331 and 333 provided on the thin film member 310, first and second upper electrodes 341 and 343 provided on one surfaces of the first and second piezoelectric members 331 and 333, respectively, and first and second lower electrodes 351 and 353 provided on the other surfaces of the first and second piezoelectric members 331 and 333, respectively.

The first and second piezoelectric members 331 and 333 may be disposed on the thin film member 310 to be spaced apart from each other, and displacement may be generated therein according to displacement generated on one side and the other side of the thin film member 310.

Figure 8:
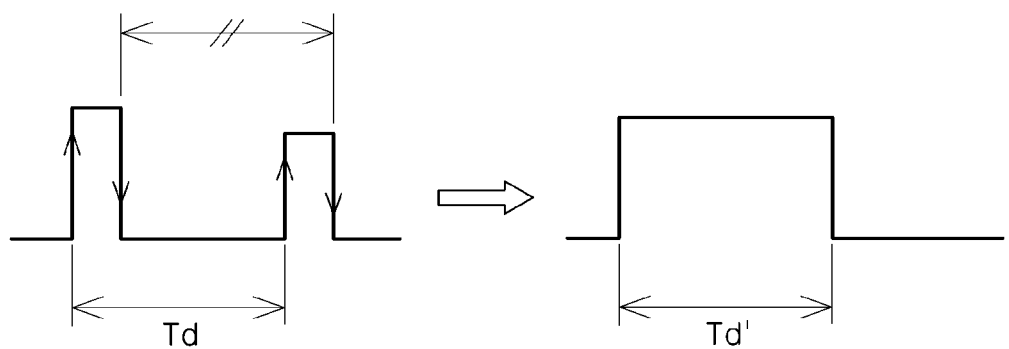
FIG. 8 is a view illustrating a signal conversion of a wireless switch according to an exemplary embodiment in the present disclosure.

FIG. 8 is a schematic view illustrating a method of setting a magnitude of an RF communications signal in a wireless switch according to an exemplary embodiment in the present disclosure.

First, in a case in which a user presses the turn-on button 160, voltages may be generated by displacement of the piezoelectric members 130, 230, 331 and 333, and in a case in which a user removes force being applied to the turn-on button 160, displacement may be re-generated in the piezoelectric members 130, 230, 331, and 333 by elastic force of the thin film members 110, 210, and 310.

Therefore, in the energy harvesting units 100, 200, and 300 according to exemplary embodiments, when a user presses the turn-on button 160, the voltage may be generated, and even when a user removes the force being applied to the turn-on button 160, the voltage may be generated.

That is, in the energy harvesting units 100, 200, and 300, two output pulses may be created by the input of the turn-on button. In this case, a pulse width Td between the two output pulses may be measured, and a magnitude of an RF communications signal transmitted by the wireless signal transmitting unit 700 may be changed depending on the measured pulse width Td.

The pulse width Td may be in proportion to a time for which a user presses the turn-on button 160, and the magnitude of the RF communications signal to be transmitted may be changed depending on the time for which a user presses the turn-on button 160.

That is, the wireless signal transmitting unit may transmit the RF communications signal by adjusting the magnitude thereof to transmit a dimming signal to an external electronic device such as a lighting device.

Therefore, illumination may be changed by an external electronic device such as a lighting device, depending on the magnitude of the received RF communications signal.

Figure 9:
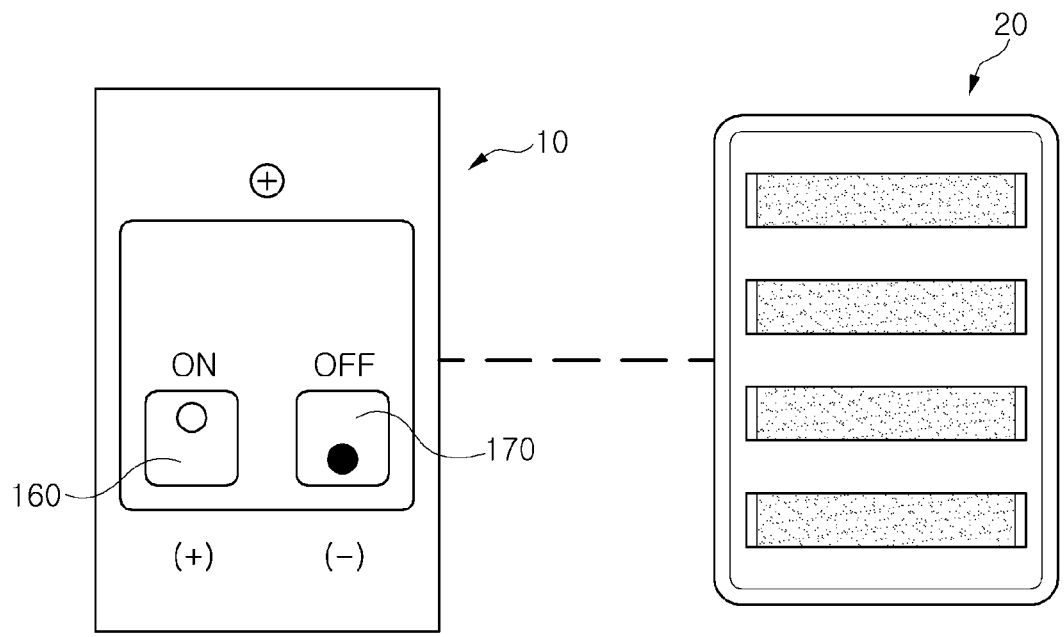
FIG. 9 is a view illustrating configurations of a wireless switch and a lighting device using the same according to an exemplary embodiment in the present disclosure.

An application example of the wireless switch will be described with reference to FIG. 9.

The wireless switch 10 according to the present exemplary embodiment may control a remote device 20. For example, the wireless switch 10 may control the remote device 20 disposed in a position in which a user may directly operate the remote device 20, such as on a ceiling, or the like. For example, the wireless switch 10 may control a lighting device including a plurality of light sources 28. However, the remote device that may be controlled by the wireless switch 10 is not limited to the lighting device. For example, the wireless switch 10 may control an air conditioner disposed on the ceiling. Alternatively, the wireless switch 10 may control a projector disposed on the ceiling.

The wireless switch 10 according to the present exemplary embodiment may include a plurality of buttons 160 and 170. For example, the wireless switch 10 may include a first button 160 configured to generate first and second signals and a second button 170 configured to generate a third signal.

The first button 160 may generate a signal for operating a control unit of the remote device 20. For example, the first signal of the first button 160 may allow the remote device 10 to perform a specific function. Alternatively, the second signal of the first button 160 may allow the remote device 10 to stop a specific function.

The second button 170 may generate a signal for controlling a power supply unit of the remote device 20. For example, the third signal of the second button 170 may allow the remote device 10 to stop all functions.

Figure 10:
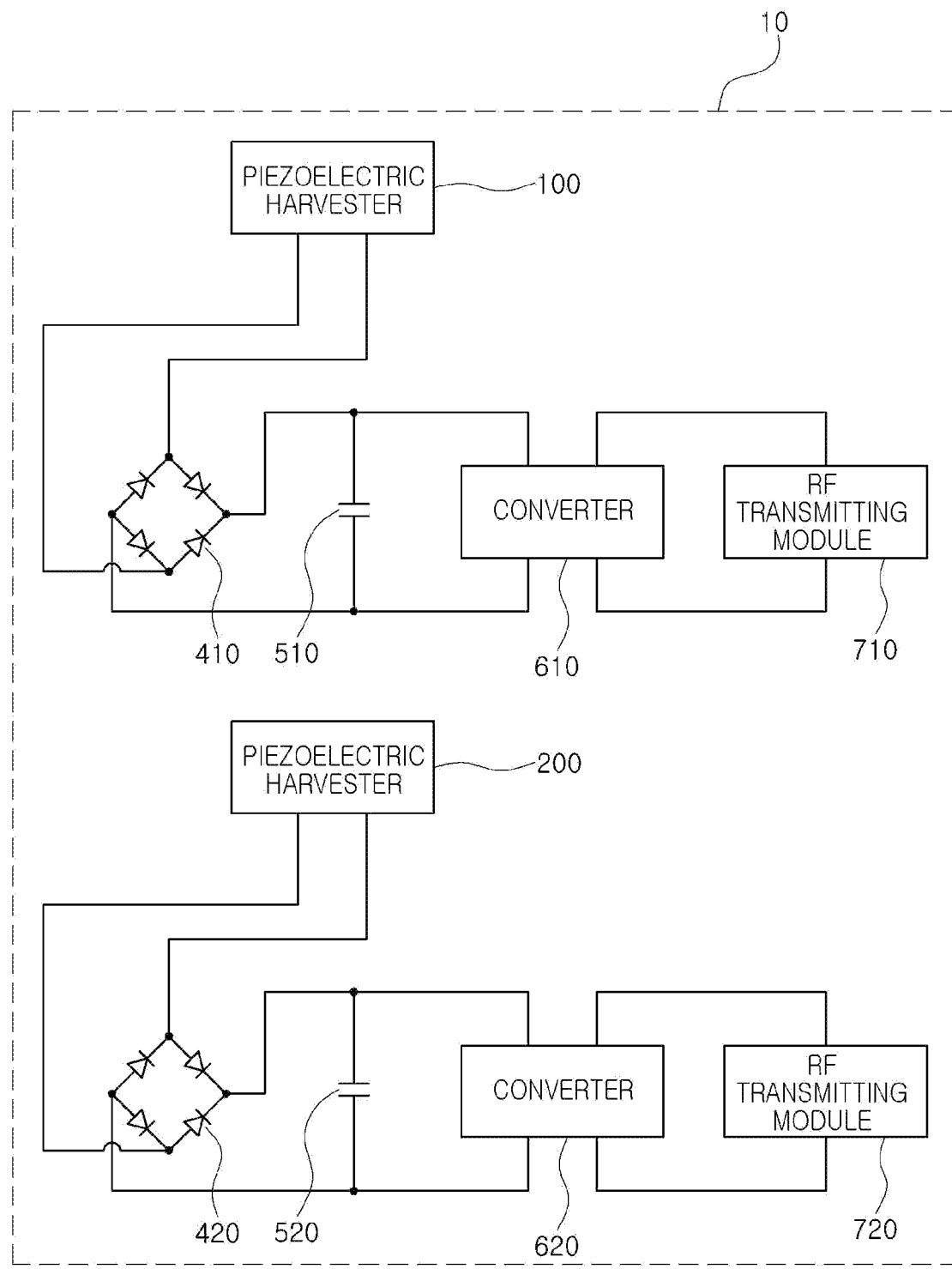
FIG. 10 is a view illustrating a configuration of the wireless switch illustrated in FIG. 9.

A configuration of the wireless switch will be described with reference to FIG. 10.

The wireless switch 10 according to the present exemplary embodiment may include energy harvesting units for respective buttons. For example, the wireless switch 10 may include a first energy harvesting unit 100 for the first button 160 and a second energy harvesting unit 200 for the second button 170.

The energy harvesting units 100 and 200 may include components converting piezoelectric energy generated by the buttons 160 and 170 into electrical signals. The configurations of the first energy harvesting unit 100 and the second energy harvesting unit 200 may be substantially the same as or similar to each other. For example, the first energy harvesting unit 100 and the second energy harvesting unit 200 may include rectifiers 410 and 420, capacitors 510 and 520, and converters 610 and 620, respectively. The above-mentioned components may convert energy generated by the energy harvesting units 100 and 200 by manipulation of the buttons 160 and 170 into electrical signals. Alternatively, the first energy harvesting unit 100 and the second energy harvesting unit 200 may include first and second wireless signal transmitting units 710 and 720, respectively. The wireless signal transmitting units 710 and 720 may convert the electrical signals generated by the energy harvesting units 100 and 200 into wireless signals appropriate for controlling the remote device 20.

The first energy harvesting unit 100 and the second energy harvesting unit 200 may be configured to generate different wireless signals. For example, the first energy harvesting unit 100 and the second energy harvesting unit 200 may have different sizes. For example, a piezoelectric member of the first energy harvesting unit 100 may be smaller or larger than a piezoelectric member of the second energy harvesting unit 200. Alternatively, the first rectifier 410 and the second rectifier 420 may be configured to rectify different types of current. Alternatively, capacitance of the first capacitor 510 and capacitance of the second capacitor 520 may be different from each other.

The wireless switch 10 configured as described above may transmit different wireless signals from the first energy harvesting unit 100 and the second energy harvesting unit 200 to control the remote device 20.

Figure 11:
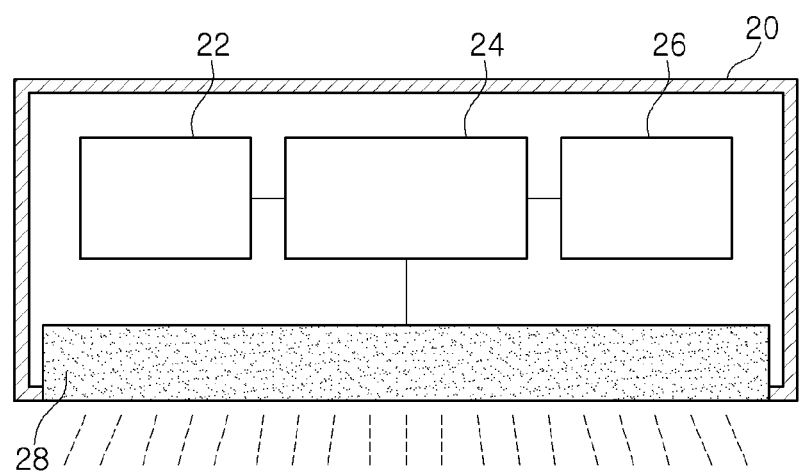
FIG. 11 is a view illustrating a configuration of a remote device illustrated in FIG. 9.

Main components of the remote device will be described with reference to FIG. 11.

The remote device 20 may include a wireless signal receiving unit 22, a control unit 24, and a power supply unit 26. However, the remote device 20 is not limited to including the above-mentioned components. For example, the remote device 20 may further include a component capable of performing a specific function, such as a light source 28.

The wireless signal receiving unit 22 may be configured to receive the wireless signals transmitted by the wireless switch 10. For example, the wireless signal receiving unit 22 may be configured to transmit and receive frequencies within the same band as that of the wireless signal transmitting units 710 and 720 of the wireless switch 10. The wireless signal receiving unit 22 may convert the wireless signals from the wireless signal transmitting unit 710 and 720 into set electrical signals. For example, the wireless signal receiving unit 22 may convert a wireless signal from the first wireless signal transmitting unit 710 into a first signal or a second signal. Alternatively, the wireless signal receiving unit 22 may convert a wireless signal from the second wireless signal transmitting unit 720 into a third signal. The wireless signal receiving unit 22 configured as described above may be connected to the control unit 24.

The control unit 24 may be operated depending on signals transmitted from the wireless signal receiving unit 22. For example, when the control unit 24 receives the first signal from the wireless signal receiving unit 22, the control unit 24 may generate a control signal so that the light source 28 is turned on. In addition, when the control unit 24 receives the first signal from the wireless signal receiving unit 22, the control unit 24 may generate a control signal so that illumination of the turned-on light source 28 is gradually increased. Alternatively, when the control unit 24 receives the second signal from the wireless signal receiving unit 22, the control unit 24 may generate a control signal so that illumination of the turned-on light source 28 is maintained in a current state. Alternatively, when the control unit 24 receives the third signal from the wireless signal receiving unit 22, the control unit 24 may generate a control signal so that the light source 28 is turned off. In this case, the control unit 24 may turn the light source 28 off by controlling the power supply unit 26.

The control unit 24 may be configured to adjust the illumination of the light source 28. For example, the control unit 24 may control a magnitude of a current from the power supply unit 28 to the light source 28 to adjust the illumination of the light source 28. Alternatively, the control unit 24 may control a magnitude of resistance of a circuit for connecting the power supply unit 26 and the light source 28 to each other to adjust the illumination of the light source 28.

The wireless switch 10 and the remote device 20 configured as described above are able to perform turn-on and turn-off operations and adjust the illumination of the light source 28, while having a simple configuration.

As set forth above, according to exemplary embodiments in the present disclosure, a wireless switch not requiring a separate power source may be provided.

While exemplary embodiments have been shown and described above, it will be apparent to those skilled in the art that modifications and variations could be made without departing from the scope of the present invention as defined by the appended claims.

What is claimed is:

1. A wireless switch comprising:
    an energy harvesting unit configured to generate a first signal and a second signal, in response to a first button being pressed and the first button being released, respectively;
    a measuring unit configured to measure a period of time from a time at which the first signal is generated to a time at which the second signal is generated; and
    a wireless signal transmitting unit configured to transmit a control signal depending on the period of time.

2. The wireless switch of claim 1, wherein the energy harvesting unit comprises a piezoelectric member configured to generate the first and second signals depending on an operation of the first button.

3. The wireless switch of claim 1, wherein the energy harvesting unit comprises a second button that is provided to generate a third signal.

4. The wireless switch of claim 1, wherein the energy harvesting unit comprises:
    a support member;
    a piezoelectric member disposed on the support member; and the first button and a second button applying pressure to the piezoelectric member.

5. The wireless switch of claim 4, wherein the piezoelectric member comprises:
a first piezoelectric member configured to generate energy through the pressure applied by the first button; and
a second piezoelectric member configured to generate energy through the pressure applied by the second button.

6. The wireless switch of claim 1, wherein a pulse width of the control signal is based on the period of time.

7. A wireless switch comprising:
a first energy harvesting unit configured to generate a first signal in response to a first button being pressed, to generate a second signal in response to the first button being released, and to generate a control signal based on a time period from when the first signal is generated to when the second signal is generated;
a second energy harvesting unit configured to generate a third signal in response to a second button is pressed; and
a wireless signal transmitting unit configured to transmit the signals generated by the first and second energy harvesting units, to a remote device.

8. The wireless switch of claim 7, wherein the first signal is a signal for initiating an operation of a control unit of the remote device.

9. The wireless switch of claim 7, wherein the second signal is a signal for stopping an operation of a control unit of the remote device.

10. The wireless switch of claim 7, wherein the third signal is a signal for blocking supply of power to the remote device.

11. The wireless switch of claim 8, wherein the control unit is configured to control a magnitude of a voltage or a current supplied to the remote device.

* * * * *